United States Patent [19]

Babb

[11] Patent Number: 5,751,744
[45] Date of Patent: May 12, 1998

[54] ERROR DETECTION AND CORRECTION CIRCUIT

[75] Inventor: Brendan J. Babb, Anchorage, Ak.

[73] Assignee: Advanced Micro Devices, Inc., Sunnyvale, Calif.

[21] Appl. No.: 379,107

[22] Filed: Jan. 27, 1995

Related U.S. Application Data

[63] Continuation of Ser. No. 11,578, Feb. 1, 1993, abandoned.

[51] Int. Cl.$^6$ ............................................. G06F 11/10
[52] U.S. Cl. ................................. 371/49.1; 371/30
[58] Field of Search .................... 371/40.1, 40.2, 371/40.4, 37.2, 37.5, 38.1, 39.1, 30, 37.1, 37.7; 395/185.01, 185.05, 438, 479, 185.7, 185.5, 475; 364/228.1, 228.3, 265, 265.3, 266.3

[56] References Cited

U.S. PATENT DOCUMENTS

| | | | |
|---|---|---|---|
| 3,893,070 | 7/1975 | Bossen et al. | 371/40.1 |
| 4,236,247 | 11/1980 | Sundberg | 371/38.1 |
| 4,335,460 | 6/1982 | Bolcavage et al. | 371/49.1 |
| 4,509,172 | 4/1985 | Chen | 371/38.1 |
| 4,564,944 | 1/1986 | Arnold et al. | 371/37.2 |
| 4,604,751 | 8/1986 | Aichelmann, Jr. et al. | 371/38.1 |
| 4,608,687 | 8/1986 | Dutton | 371/10.1 |
| 4,631,725 | 12/1986 | Takamura et al. | 371/39.1 |
| 4,654,847 | 3/1987 | Dutton | 371/38.1 |
| 4,661,955 | 4/1987 | Arlington et al. | 371/38.1 |
| 4,689,792 | 8/1987 | Traynor | 371/38.1 |
| 4,884,271 | 11/1989 | Concho et al. | 371/40.2 |
| 4,918,695 | 4/1990 | Scheuneman et al. | 371/51.1 |
| 4,977,559 | 12/1990 | McCambridge | 371/57.1 |
| 4,993,028 | 2/1991 | Hillis | 371/39.1 |
| 5,220,567 | 6/1993 | Cooley et al. | 371/5.1 |
| 5,251,219 | 10/1993 | Babb | 371/37.4 |
| 5,291,498 | 3/1994 | Jackson et al. | 371/40.1 |
| 5,414,859 | 5/1995 | Staudacher et al. | 395/575 |
| 5,463,644 | 10/1995 | Rodi et al. | 371/40.4 |
| 5,491,702 | 2/1996 | Kinsel | 371/37.2 |

OTHER PUBLICATIONS

Redinbo et al. "Multibit correcting data Interface for Fault-Tobrant Systems" IEEE 1993, pp. 433–446.

Rolf Johansson "A Class of (12,8) Codes for Correcting Single Errors and Detecting Double Errors within a Nibble" IEEE 1993, pp. 1504–1506.

"Nibble-based Error Detection or Correction (EDOC) Chip", Electronics Letters 26th Oct. 1989 vol. 25 No. 22, pp. 1542–1543.

*Primary Examiner*—Albert Décady
*Attorney, Agent, or Firm*—Sawyer & Asociates

[57] ABSTRACT

A manipulated error detection matrix by which check bits are generated and decoded so that errors that are detected are next to each other and occur within a nibble. The invention consists of a check bit generator 14 which generates check bits in accordance with a nibble protect matrix according to a Modified Hamming Code which is configured to provide detection of triple and quadruple bit errors occurring within a nibble. The check bits are compared to those in memory 12 by a syndrome generator 16. An error corrector 18 and an error detector 20 decode syndrome bits.

12 Claims, 4 Drawing Sheets

FIG. 2

Parity check matrix with rows CB (PARITY), CX (EVEN XOR), C0 (EVEN XOR), C1 (ODD XNOR), C2 (ODD XNOR), C4 (EVEN XOR), C8 (EVEN XOR), C16 (EVEN XOR) and columns for participating data bits 0 through 31.

FIG. 6

Parity check matrix with rows CB (PARITY), CX (EVEN XOR), C0 (EVEN XOR), C1 (ODD XNOR), C2 (ODD XNOR), C4 (EVEN XOR), C8 (EVEN XOR), C16 (EVEN XOR) and columns for participating data bits 0 through 31.

|  |  |  |  | S16 | 0 | 1 | 0 | 1 | 0 | 1 | 0 | 1 |
|  |  |  |  | S8 | 0 | 0 | 1 | 1 | 0 | 0 | 1 | 1 |
|  |  |  |  | S4 | 0 | 0 | 0 | 0 | 1 | 1 | 1 | 1 |
| SX | S0 | S1 | S2 |  |  |  |  |  |  |  |  |  |
|---|---|---|---|---|---|---|---|---|---|---|---|---|
| 0 | 0 | 0 | 0 | * | C16 | C8 | T | C4 | T | T | 30 |  |
| 0 | 0 | 0 | 1 | C2 | T | T | 27 | T | 5 | M | T |  |
| 0 | 0 | 1 | 0 | C1 | T | T | 25 | T | 3 | 15 | T |  |
| 0 | 0 | 1 | 1 | T | M | 13 | T | 23 | T | T | M |  |
| 0 | 1 | 0 | 0 | C0 | T | T | 24 | T | 2 | M | T |  |
| 0 | 1 | 0 | 1 | T | 1 | 12 | T | 22 | T | T | M |  |
| 0 | 1 | 1 | 0 | T | M | 10 | T | 20 | T | T | M |  |
| 0 | 1 | 1 | 1 | 16 | T | T | M | T | M | M | T |  |
| 1 | 0 | 0 | 0 | CX | T | T | M | T | M | 14 | T |  |
| 1 | 0 | 0 | 1 | T | M | 11 | T | 21 | T | T | M |  |
| 1 | 0 | 1 | 0 | T | M | 9 | T | 19 | T | T | 31 |  |
| 1 | 0 | 1 | 1 | M | T | T | 29 | T | 7 | M | T |  |
| 1 | 1 | 0 | 0 | T | M | 8 | T | 18 | T | T | M |  |
| 1 | 1 | 0 | 1 | 17 | T | T | 28 | T | 6 | M | T |  |
| 1 | 1 | 1 | 0 | M | T | T | 26 | T | 4 | M | T |  |
| 1 | 1 | 1 | 1 | T | 0 | M | T | M | T | T | M |  |

\* = No errors detected
Number = The bit number of the single bit-in-error
T = Two errors detected
M = More than two errors detected

FIG. 5

ERROR DETECTION AND CORRECTION CIRCUIT

This is a continuation of application Ser. No. 08/011,578 filed on Feb. 1, 1993, now abandoned.

BACKGROUND OF THE INVENTION

1. Field of the Invention

The present invention relates to error detection and correction codes. More specifically, the present invention relates to techniques for correcting check bit errors.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

A typical memory chip is a square array of data-storage cells. The 64K chip, for example, consists of an array of 256 by 256 data-storage cells. Each cell stores one bit, a 0 or a 1. The 0's and 1's stored in a memory chip are represented by the presence or absence of negative electric charge at sites in the silicon crystal. Each site has an electrical property which makes it a potential well or electronic trap for negative charge. When a 0 is to be stored in a given cell, the potential well at the site is filled with electrons. When a 1 is to be stored, the well is emptied of electrons. When the cell is read, its negative charge is measured. If the charge exceeds a certain value, the stored bit is declared to be a 0, otherwise it is declared to be a 1.

Errors can occur when a cell loses its charge, or if an uncharged potential well acquires a charge. Hard errors occur when a given cell is stuck at 0 or stuck at 1 or toggling between 0 and 1.

Error correcting codes help correct most errors that occur when data is stored or read from computer memories. Error correcting codes, such as the Hamming Code, group data bits together with parity bits into a codeword using an encoding algorithm. The parity bits act as checks for the data bits. Errors occurring in the storing or reading of data bits from the computer memory are detected and corrected with a decoding algorithm.

High speed error detection and correction (EDC) chips use a Modified Hamming Code (MHC) to perform single error correction/double error detection. Current EDC chips detect some triple and quadruple errors, but, in some cases, a triple bit error is mistaken for a single bit error and miscorrected. In other cases, quadruple bit errors are seen by the EDC device and appear as if no error has occurred. For each EDC, there is a certain number of triple bit errors that are detected out of all possible triple bit errors. The same holds true for quadruple bit errors. There are a certain number that are detected and a certain amount that appear as no error.

Nibble protection in X4 memories is valuable inasmuch as the simple failure to turn on the memory appears as a single bit error in another location which the EDC device miscorrects, which increases the number of errors in the word. In most systems, the newly corrected data is now written back into memory, but, what has really happened is the three bit error combined with the miscorrected single bit are now seen as correct and are stored into memory with the related check bits. This operation has gone from the correct word to a word with four errors which now is assumed correct by the EDC simply because the DRAM was not receiving power.

The need for nibble protection also arises in the context of alpha particle errors. Current multiple bit memory architectures are such that a single alpha particle can now cause multiple bit errors.

Thus, inasmuch as conventional error detecting and correcting codes can generally detect single X4 DRAM errors, a need remains in the art for an improved modified Hamming code for correcting check bit errors which detect triple and quadruple bit errors occurring within a nibble.

SUMMARY OF THE INVENTION

The present invention addresses the need in the art by providing a novel approach to the correction of errors in check bits in an encoded data word. The present invention provides a manipulated error detection matrix by which check bits are generated and decoded so that the errors that are detected are next to each other and occur within a nibble. The invention consists of a check bit generator which generates check bits in accordance with a nibble protect matrix according to a modified Hamming code which is configured to provide detection of triple and quadruple bit errors occurring within the nibble. The invention further includes a syndrome generator, an error corrector, and an error detector. The present invention provides a powerful performance boost to error detection and correction circuits by detecting triple and quadruple bit errors occurring within a nibble.

BRIEF DESCRIPTION OF THE DRAWINGS

FIG. 2 is a table for generating check bits in an illustrative implementation of a check bit generator.

FIG. 5 is a table for decoding the syndrome bits in an illustrative implementation.

FIG. 6 is a table for generating check bits which provides detection of triple and quadruple bit errors occurring within a 4 bit nibble of a 32 bit data word.

DESCRIPTION OF THE INVENTION

Illustrative embodiments and exemplary applications will now be described with reference to the accompanying drawings to disclose the advantageous teachings of the present invention.

The nibble protect system of the present invention provides a manipulated error detection matrix by which check bits are generated and decoded so that the errors that are detected are next to each other and occur within a nibble. For example, given a data word length w=4x, the nibble protect code of the present invention detects double, triple and quadruple bit errors in the group of four and corrects single bit errors in the four bit nibble. The code also provides double bit detection throughout the entire word.

This is made clear from the following discussion. Given a data word of length w and k appropriate check bits, then n=w+k is the total length of the word size needed to store in memory for EDC. The MHC contains a matrix, k rows by n columns of ones and zeros. The rows are such that when a word from memory is brought in and multiplied by the matrix transpose then the resulting product is all zeros. This matrix detects a certain number of errors and either miscorrects or does not detect the rest of the possible errors. By rearranging the columns of the matrix, the error detection/correction ability of the matrix does not change but the location of the errors does change. For example, a three bit error that appears as a single bit error occurs because the three columns corresponding to the locations of the errors add up to another column of the matrix and the device interprets the new column as the single bit error and miscorrects at the error position. It does not matter where the columns are located so the three columns can be moved so that they are located anywhere in the matrix. The invention finds groups of say four columns so that any three of them added together doesn't add up to any other column in the matrix. This allows triple error protection in a group of four. It is also necessary that the sum of all four columns does not add up to all zeros because this is the representation of no errors. The inventive nibble protect matrix is a matrix such that the columns are arranged into disjoint groups of four, for example, such that for any group of four, all possible 4 single bit errors are detected and corrected, and all 6 double bit errors are detected, all 4 triple bit errors are detected and the single quadruple bit error is detected. For example, given a 12 bit word, there would be three nibbles, (1,2,3,4) and (5,6,7,8) and (9,10,11,12).

Figure 1:
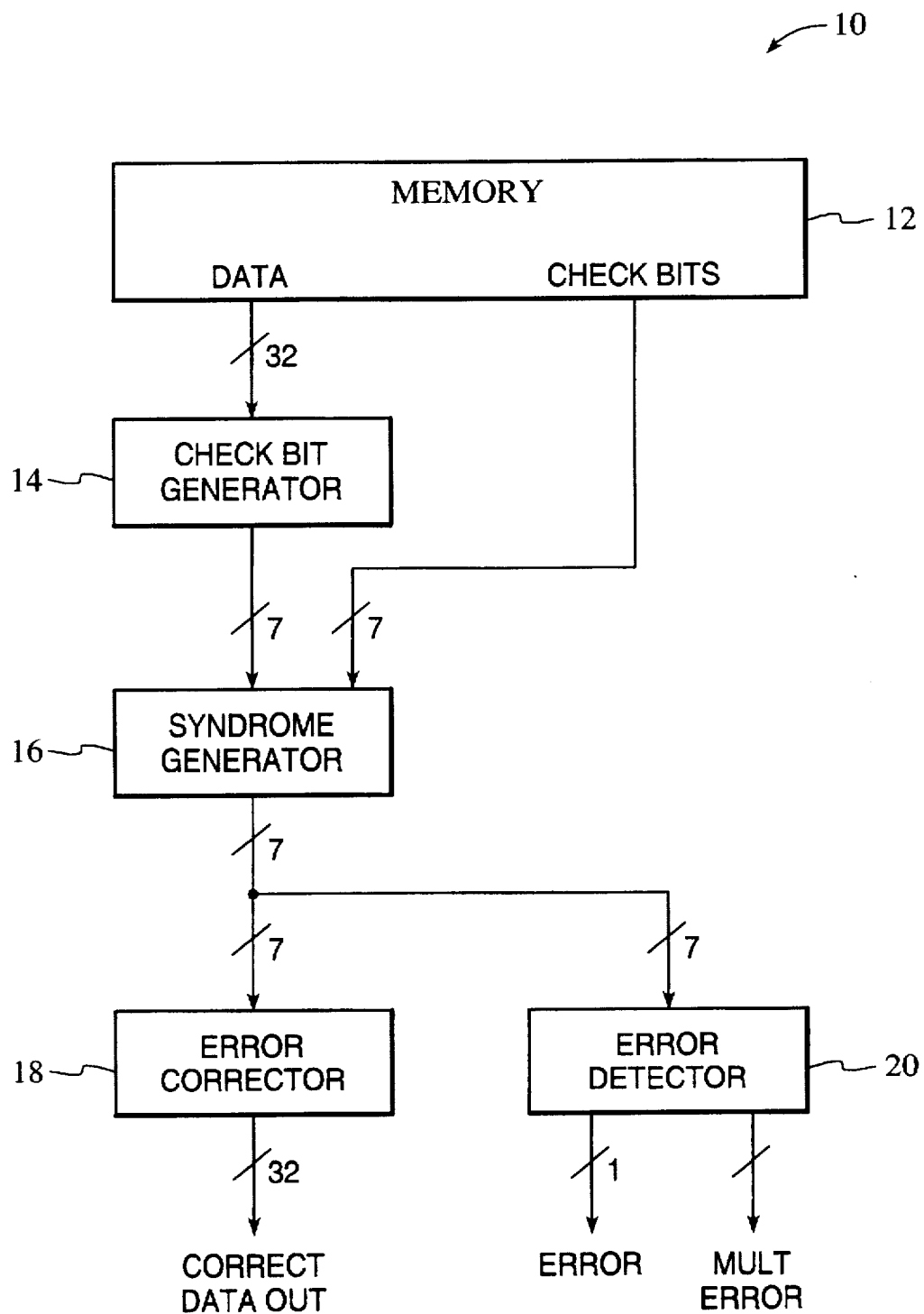
FIG. 1 is a schematic diagram of an illustrative implementation of a 32 bit error detection and correction circuit constructed in accordance with the teachings of the present invention.

FIG. 1 is a schematic diagram of an illustrative implementation of a 32 bit error detection and correction circuit constructed in accordance with the teachings of the present invention. In the preferred embodiment, the 32 bit error detection and correction circuit 10 includes a memory chip 12 which stores an encoded word. In the illustrative embodiment, the encoded word is a 32 bit data word and 7 check bits. As discussed more fully below, and in accordance with the present teachings, a check bit generator 14 reads the 32 bit data word from the memory chip 12 and generates 7 additional check bits according to a modified Hamming Code.

FIG. 2 is an illustrative table for generating check bits for a 32 bit data word. Each check bit is generated by either XORing or XNORing selected groups of bits from the 32 bit data word. For example, check bit CX is generated by XORing data bits 0, 4, 6, 7, 8, 9, 11, 14, 17, 18, 19 21, 26, 28, 29 and 31. The check bits can be defined as a 1×7 matrix [CB] such that $$[CB] = [D, 0][H^T] \quad [1]$$

where [D,0] is the 32 bit data word and 7 "0"s represent the undetermined check bits. [H$^T$] is the nibble protect matrix [H] transposed.

The nibble protect matrix H for an odd number of check bits is constructed as follows. Given r checkbits, where r is odd and r is greater than 3, let s=(r−1)/2. Next, list all possible s by 1 vectors with 0's and 1's as entries.

For example, given r=7, then s=3. There are $2^s$ different vectors. The $2^3$=8 vectors are shown below.

| 0 | 0 | 0 | 0 | 1 | 1 | 1 | 1 |
|---|---|---|---|---|---|---|---|
| 0 | 0 | 1 | 1 | 0 | 0 | 1 | 1 |
| 0 | 1 | 0 | 1 | 0 | 1 | 0 | 1 |

Choose one of the vectors to be g, preferably the vector with the most ones in it. Divide the remaining vectors into two sets, those with even parity (even number of ones in the vector), and those with odd parity (odd number of ones in the vector). The vectors are shown below.

| 1 | 0 | 0 | 1 | 1 | 0 | 0 | 1 |
|---|---|---|---|---|---|---|---|
| 1 | 0 | 1 | 0 | 1 | 0 | 1 | 0 |
| 1 | 0 | 1 | 1 | 0 | 1 | 0 | 0 |
| g |   | even |   |   | odd |   |   |

Let $f_i$ be the ith even vector, and $f_j$ be the jth odd vector. If g is odd, a $H_{ij}$ block of four vectors can be constructed, all of length r.

$$\begin{bmatrix} g+f_i+f_j & g+f_i+f_j & f_i & f_j \\ f_i & f_j & g+f_i+f_j & g+f_i+f_j \\ 1 & 0 & 1 & 0 \end{bmatrix} = H_{ij}$$

where i goes from 1 to $2^{(s-1)}$ and j goes from 1 to $2^{(s-1)}-1$.

If g is even, $H_{ij}$ can be constructed using the following matrix.

$$\begin{bmatrix} g+f_i+f_j & g+f_i+f_j & f_i & f_j \\ f_i & f_j & g+f_i+f_j & g+f_i+f_j \\ 0 & 1 & 0 & 1 \end{bmatrix} = H_{ij}$$

where i goes from 1 to $2^{(s-1)}-1$ and j goes from 1 to $2^{(s-1)}$.

In both cases, there are $t=[2^{(s-1)}*2^{(s-1)}-1]$ different $H_{ij}$ blocks. So there are 4t different vectors used and each block can be shown to be nibble protect. Example for g odd:

$$\begin{bmatrix} g+f_i+f_j & g+f_i+f_j & f_i & f_j \\ f_i & f_j & g+f_i+f_j & g+f_i+f_j \\ 1 & 0 & 1 & 0 \\ a & b & c & d \end{bmatrix} = H_{ij}$$

where i goes from 1 to $2^{(s-1)}$ and j goes from 1 to $2^{(s-1)}-1$. Every vector is odd, since $g+f_i+f_j$ is odd+even+odd=even. g is odd, $f_i$ is even, and $f_j$ is odd. So the columns parity is as follows:

| [ even | even | even | odd  ] |
|--------|------|------|--------|
| [ even | odd  | even | even ] |
| [ 1    | 0    | 1    | 0    ] |
| odd    | odd  | odd  | odd    |
| a      | b    | c    | d      |

So every vector is odd and unique. This ensures that the matrix provide single error correction and double error detection.

$$a+b+c = \begin{matrix} [g+f_i+f_j+g+f_i+f_j+f_i] \\ [f_i+f_j+g+f_i+f_j] \\ [1+0+1] \end{matrix} \quad \begin{matrix} [f_i] \\ =[g] \\ [0] \end{matrix}$$

The sum of the three odd vectors results in an odd vector. The other possible three bit errors can be checked, and their resultant sums are as follows:

$$a+b+d = \begin{bmatrix} f_i \\ |g| \\ |0| \end{bmatrix}$$

$$a+c+d = \begin{bmatrix} |g| \\ |f_i| \\ |0| \end{bmatrix}$$

$$b+c+d = \begin{bmatrix} |g| \\ |f_i| \\ |0| \end{bmatrix}$$

In all cases the sum of the three vectors results in a vector containing g in the upper half or lower half, which never occurs in the constructed vectors, so a multiple error is detected.

$$a+b+c+d = \begin{bmatrix} |f_i+f_j| \\ |f_i+f_j| \\ |0| \end{bmatrix}$$

This is the representation of a four bit error. It does not equal 0 so it is recognized as a multiple error.

To construct an r by $2^{(r-2)}+r$ Hamming matrix, take all blocks that contain the checkbits, then try to take the blocks with the least number of ones. Add the checkbit vector that is all zeros except for the one in the rth place. If r (mod 4) is 0 then you form a block that contains the rth checkbit vector and three all zero vectors. If r (mod 4) is 1 then you take any vector that hasn't been used and add the rth checkbit vector and two zero vectors to form a block of four. If r (mod 4) is 2 then take two vectors that haven't been used and such that the sum of them and the rth checkbit vector is not equal o a vector already used. If r (mod 4) is 3 then take the rth checkbit vector and 3 vectors that haven't been used such that the block of four is nibble protect. This constructs a nibble protect matrix. The matrix is encoded in logic in the check bit generator 14. That is, the matrix is used to determine the participating data bits of each XOR or XNOR gate in the check bit generator 14 to generate a set of check bits for a given data word.

Figure 3:
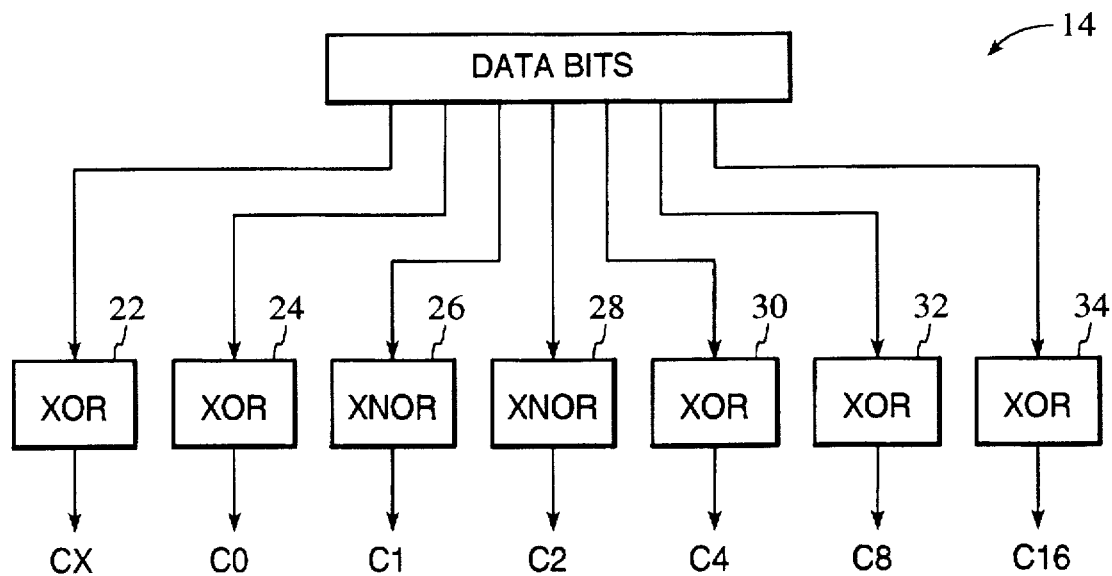
FIG. 3 is a schematic diagram of an illustrative implementation of a check bit generator constructed in accordance with the teachings of the present invention.

FIG. 3 is a schematic diagram of an illustrative implementation of a check bit generator 14 constructed in accordance with the teachings of the present invention. In this particular implementation, the check bit generator 14 consists of 5 XOR gates and 2 XNOR gates, each with 16 inputs. A first XOR gate 22 generates CX from the XOR sum of data bits 0, 4, 6, 7, 8, 9, 11, 14, 17, 18, 19, 21, 26, 28, 29, and 31. A second XOR gate 24 generates check bit C0 from the XOR sum of 16 data bits according to the table shown in FIG. 2. A XNOR gate 26 generates check bit C1 from the XNOR sum of 16 data bits. A second XNOR gate 28 generates check bit C2. A third XOR gate 30 generates check bit C4. A fourth XOR gate 32 generates check bit C8. Similarly, a fifth XOR gate 34 generates check bit C16.

Figure 4:
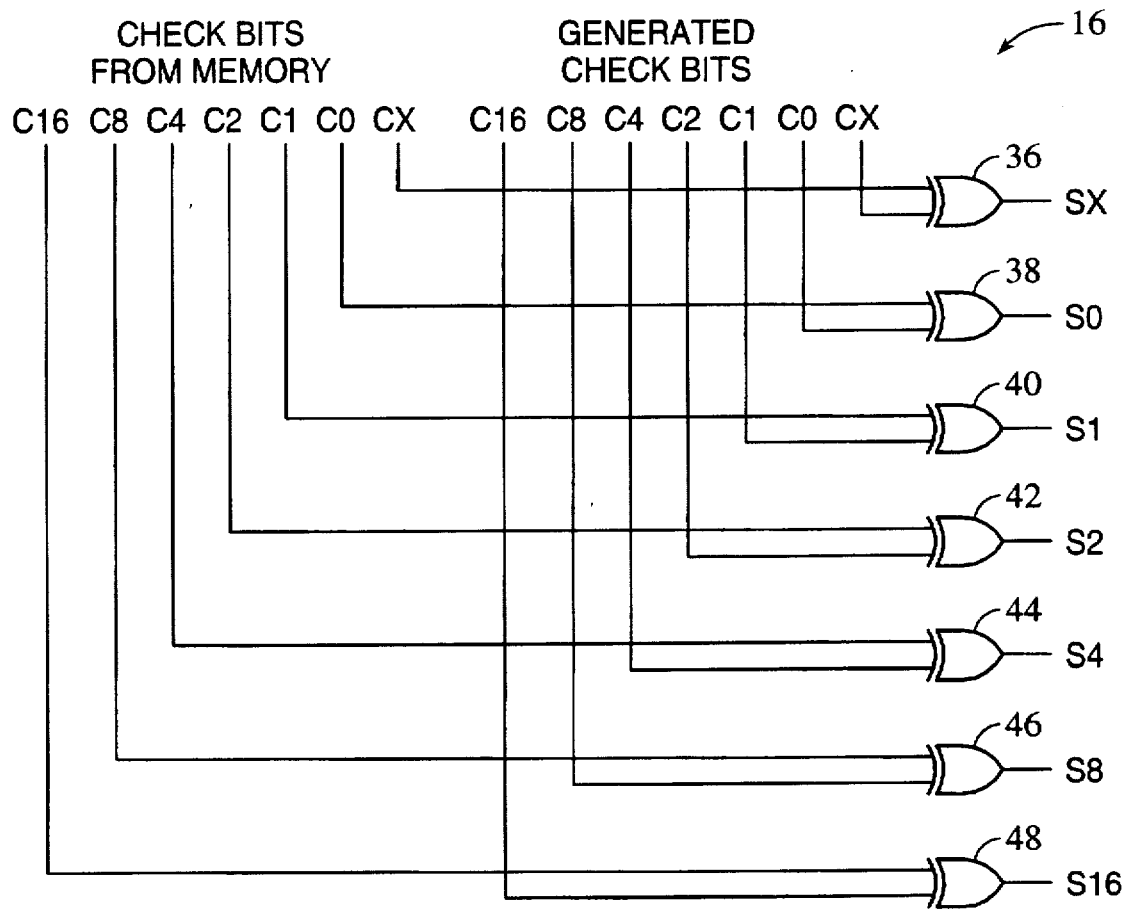
FIG. 4 is a schematic diagram of an illustrative implementation of a 7 bit syndrome generator constructed in accordance with the teachings of the present invention.

Returning to FIG. 1, a syndrome generator 16 compares the newly generated check bits with the 7 check bits stored in the memory chip 12 and generates 7 syndrome bits SX through S16. The syndrome generator 16 may be implemented with 7 2-bit XOR gates 36 through 48 as shown in FIG. 4. A first XOR gate 36 generates syndrome bit SX from the XOR sum of CX from memory and CX generated by the check bit generator. A second XOR gate 38 generates syndrome bit S0. A third XOR gate 40 generates syndrome bit S1. A fourth XOR gate 42 generates syndrome bit S2. A fifth XOR gate 44 generates syndrome bit S4. A sixth XOR gate 46 generates syndrome bit S8. Similarly, a seventh XOR gate 48 generates syndrome bit S16.

The syndrome bits can be defined as a 1×7 matrix [S] such that $$[S]=[D,CB][H^T] \quad [2]$$

where [D,CB] is the 32 bit data word and the 7 check bits. $[H^T]$ is the matrix [H] transposed.

The matrix illustrated in FIG. 2 can also be organized as 32 1×7 matrices. Each data bit d[y] can be represented as a 1×7 vector as shown in equation [3]:

$$D[y] = d\begin{bmatrix} CX \\ C0 \\ C1 \\ C2 \\ C4 \\ C8 \\ C16 \end{bmatrix} \quad [3]$$

where d[CB]=1 if it participates in the check bit encoding and d[CB]=0 if it does not participate in the check bit encoding. The syndrome bits can then be equated using equation [4]:

$$\begin{bmatrix} SX \\ S0 \\ S1 \\ S2 \\ S4 \\ S8 \\ S16 \end{bmatrix} = \begin{bmatrix} d_y[CX] \\ d_y[C0] \\ d_y[C1] \\ d_y[C2] \\ d_y[C4] \\ d_y[C8] \\ d_y[C16] \end{bmatrix} \quad [4]$$

In other words, the syndrome bits will equal D[y] for single bit errors. Similarly, the syndrome bits can be derived for multiple bit errors in equation [5]:

$$\begin{bmatrix} SX \\ S0 \\ S1 \\ S2 \\ S4 \\ S8 \\ S16 \end{bmatrix} = \begin{bmatrix} d_{x1}[CX]+d_{x2}[CX]+\ldots+d_{xn}[CX] \\ d_{x1}[C0]+d_{x2}[C0]+\ldots+d_{xn}[C0] \\ d_{x1}[C1]+d_{x2}[C1]+\ldots+d_{xn}[C1] \\ d_{x1}[C2]+d_{x2}[C2]+\ldots+d_{xn}[C2] \\ d_{x1}[C4]+d_{x2}[C4]+\ldots+d_{xn}[C4] \\ d_{x1}[C8]+d_{x2}[C8]+\ldots+d_{xn}[C8] \\ d_{x1}[C16]+d_{x2}[C16]+\ldots+d_{xn}[C16] \end{bmatrix} \quad [5]$$

Applying equation [5] and using the matrix shown in FIG. 2, if data bits 0, 1, and 2 were in error, SX, S0, S1, S4, and S16 would be at logic level "1", while S2 and S8 would be logic level 0. This would be the same result had data bit 4 had a single bit error. The MHC shown in FIG. 2 cannot distinguish the triple bit error within the first nibble from a single bit error. According to the decoding matrix shown in FIG. 5, the triple bit error would be misdetected as a single bit error and miscorrected as a single bit error.

FIG. 6 is a table for generating check bits which provides detection of triple and quadruple bit errors occurring within a nibble. The matrix is constructed such that any triple or quadruple bit error which occurs within a nibble results in unique syndrome bits. The matrix still detects and corrects all single bit errors and detects double bit errors throughout the data word.

Returning again to FIG. 1, a conventional error corrector 18 receives the 7 syndrome bits from the syndrome generator 16 along with the 32 data bits from memory and outputs 32 corrected data bits.

A conventional error detector 20 decodes the 7 syndrome bits from the syndrome generator 16 and detects the presence of either a single error, a multiple error, or no errors in the 32 bit data word.

Thus, the present invention has been described herein with reference to a particular embodiment for a particular application. Those having ordinary skill in the art and access to the present teachings will recognize additional modifications applications and embodiments within the scope thereof. For example, the invention is not limited to a specific number of bits in the data word. Nor is the invention limited to a specific number of check bits. For this reason, the invention is readily adaptable to error detection and correction circuits requiring a different number of check bits. Circuits using a different error detection and correction code can also make use of the teachings of the present invention. Further, the invention is not limited to the technique by which the desired logic is generated. Functionally equivalent logic may be used wherever applicable. In some cases, reverse logic may be used without departing from the scope of the present invention.

It is therefore intended by the appended claims to cover any and all such applications, modifications and embodiments within the scope of the present invention.

Accordingly,

What is claimed is:

1. An improved error detection and correction circuit comprising:

first means for providing a data word and a first set of check bits;

second means for generating a second set of check bits corresponding to the data word in accordance with a nibble protect matrix in which errors that occurred in the data word are located next to each other in the matrix and within a nibble;

third means responsive to the first and second sets of check bits for detecting errors in the data word including multiple errors occurring within a nibble; and fourth means responsive to the first and second sets of check bits for correcting the data word and outputting a corrected data word.

2. The invention of claim 1 wherein the third means includes means for detecting triple bit errors occurring within a nibble.

3. The invention of claim 1 wherein the third means includes means for detecting quadruple bit errors occurring within a nibble.

4. The invention of claim 1 wherein the third means includes means for detecting both triple and quadruple bit errors occurring within a nibble.

5. The invention of claim 1 wherein the second means includes a check bit generator means, connected to the data word, for generating the second set of check bits according to a modified Hamming code configured to provide detection of multiple errors occurring within a nibble.

6. The invention of claim 1 wherein the fourth means includes syndrome generator means for generating a syndrome word.

7. The invention of claim 6 wherein the fourth means includes error corrector means for correcting the data word.

8. The invention of claim 6 wherein the syndrome generator means includes multiple XOR gates.

9. A method for detecting and correcting data bit errors including detecting triple and quadruple bit errors occurring within a nibble, the method including the steps of:

a) providing a data word and a first set of check bits;

b) generating a second set of check bits corresponding to the data word in accordance with a nibble protect matrix in which errors that occurred in the data word are located next to each other and within a nibble;

c) detecting errors in the data word including multiple errors occurring within a nibble; and d) correcting the data word and outputting a corrected data word.

10. An improved error detection and correction circuit comprising:

first means for providing an error detection matrix and second means for manipulating the error detection matrix by which check bits are generated and decoded so that errors detected that occurred in a data word are located next to each other and within a nibble.

11. The invention of claim 10 wherein the second means includes means for implementing a nibble protect matrix for an odd number of check bits.

12. An improved error detection and correction method including the steps of:

providing an error detection matrix and manipulating the error detection matrix by which check bits are generated and decoded so that errors detected that occurred in a data word are located next to each other and within a nibble.

* * * * *